United States Patent
Tsai et al.

(10) Patent No.: US 7,838,175 B2
(45) Date of Patent: Nov. 23, 2010

(54) WAFER LITHOGRAPHIC MASK AND WAFER LITHOGRAPHY METHOD USING THE SAME

(75) Inventors: Shih Cheng Tsai, Changhua County (TW); Rung Bin Lin, Kaohsiung County (TW)

(73) Assignee: Yuan-Ze University, Taoyuan County (TW)

( * ) Notice: Subject to any disclaimer, the term of this patent is extended or adjusted under 35 U.S.C. 154(b) by 440 days.

(21) Appl. No.: 11/674,959

(22) Filed: Feb. 14, 2007

(65) Prior Publication Data

US 2007/0216891 A1 Sep. 20, 2007

(30) Foreign Application Priority Data

Mar. 17, 2006 (CN) .................. 2006 1 0057084

(51) Int. Cl.
*G03F 1/00* (2006.01)
(52) U.S. Cl. .............. 430/5; 430/311; 355/53
(58) Field of Classification Search ............ 430/5, 430/22, 30, 394; 355/53, 72, 77
See application file for complete search history.

(56) References Cited

U.S. PATENT DOCUMENTS

| | | | | |
|---|---|---|---|---|
| 5,995,200 | A * | 11/1999 | Pierrat | 355/53 |
| 6,180,289 | B1 * | 1/2001 | Hirayanagi | 430/5 |
| 6,316,334 | B1 | 11/2001 | Sivilotti et al. | |
| 6,737,205 | B2 * | 5/2004 | Maltabes et al. | 430/22 |
| 6,958,292 | B2 * | 10/2005 | Hasegawa et al. | 430/311 |
| 2004/0051855 | A1 | 3/2004 | Cooper | |
| 2004/0219439 | A1 * | 11/2004 | Asano et al. | 430/5 |
| 2005/0112504 | A1 * | 5/2005 | Terasawa et al. | 430/313 |

OTHER PUBLICATIONS

China Office Action dated Apr. 3, 2009 for 2006100570848 which is a corresponding Chinese application that cites US Patent 6,316,334, CN1410831A and CN1392905A.
Corresponding Taiwan application 095109138 dated Apr. 23, 2009.
Office Action dated Apr. 13, 2010 for 200610057084.8 which is a corresponding Chinese application that cites US patent 6316334.
Office Action dated May 20, 2010 for 09920340310, which is a corresponding Chinese application that cites Us patents 5,995,200; 6,958,292; 6,737,205; 6,180,289 and US publications 2005/0112504 and 2004/0219439.

* cited by examiner

*Primary Examiner*—Mark F Huff
*Assistant Examiner*—Stewart A Fraser
(74) *Attorney, Agent, or Firm*—WPAT, P.C.; Anthony King

(57) ABSTRACT

A wafer lithographic shielding mask for fabricating a multi-project wafer (MPW) and a wafer fabrication method using the same are disclosed. The mask including a light shielding layer and at least one transparent region is used to select the layout patterns of designated chips on an MPW reticle to be exposed onto the photoresist layer on the surface of the wafer. The lithography method of fabricating MPW mainly involves disposing a wafer lithographic shielding mask for selecting the exposure regions on the MPW reticle on the light transmission path from a lithographic light source to a wafer, e.g., between the MPW reticle and the lithographic light source or between the MPW reticle and the wafer, so as to prevent some undesired chips from being fabricated on the wafer using the MPW reticle, thereby decreasing the wafer production cost.

12 Claims, 3 Drawing Sheets

WAFER LITHOGRAPHIC MASK AND WAFER LITHOGRAPHY METHOD USING THE SAME

BACKGROUND OF THE INVENTION (A) Field of the Invention p The present invention relates to a wafer lithographic shielding mask and a wafer lithography method using the same, and more particularly to a lithographic shielding mask for multi-project wafers (MPW) and a wafer lithography method using the same.

(B) Description of the Related Art

According to current techniques for fabricating MPW, layout patterns of several integrated circuits or chips from different projects are disposed in one reticle, so that the tooling cost of the reticle is shared by individual projects. The layout patterns for each chip refer to those required to be formed on the reticle for producing a working chip. However, as chips of various lengths or widths are placed in one reticle, in order to reduce the tooling cost of the reticle and the production cost of wafers, the problems of floorplanning and dicing of MPW arise. As to the floorplanning, the positions of the chips on the reticle must be determined. As to the dicing, the dicing plan which refers to a set of sawing lines being used for obtaining bare dice from a wafer is required before fabricating wafers, so as to determine the required number of wafers and facilitate wafer sawing after fabricating the wafers.

FIG. 1 shows a conventional device for a lithographic process; an MPW reticle 101 is disposed between a lithographic light source 102 and a projection lens 103. The light beam emitted from the lithographic light source 102 passes through the MPW reticle 101 and becomes a patterned light beam, and then is demagnified by the projection lens 103 and irradiated onto the photoresist surface of a wafer 104. The arrow on the surface of the wafer 104 indicates the stepping direction of exposure. Though the tooling cost of the reticle 101 of the MPW can be shared by individual projects, comparing the MPW reticle with the conventional reticle which consists of one or several copies of the layout patterns of a single chip, the cost of the lithographic process for the MPW and the cost of fabricating the required wafers are greatly increased. The main reason is that the diamond blade widely used in wafer sawing can only cut a wafer in a straight line from one side of the wafer to the other side of the wafer. Due to this limitation, sawing a certain die out of a wafer may frequently destroy many other dice in the same wafer. Conventionally, the MPW reticle is employed to fabricate chips for special projects with low-volume production requirements. As the tooling cost of reticle increases dramatically with advanced semiconductor process technology, the potentiality of using MPW reticle for larger volume production also increases considerably. However, because different production volume requirements exist among the projects participating in an MPW fabrication run, in order to produce enough bare dice for the projects with considerably large production volumes, excessive number of wafers will be fabricated. These wafers produce unwanted dice for the projects with smaller production volumes. In view of the above, the tremendous increase in the fabricating cost of the MPW is caused by the fabrication of some unwanted dice or dice destroyed by wafer sawing.

Once the dice for a certain project participating in an MPW run pass manufacturing tests, the project may proceed to a volume production. There exist two approaches to making a volume production for the project. The first approach is to reuse the MPW reticle for wafer fabrication. This is expensive and inefficient because this approach will also fabricate the dice not belonging to the underlying project. The second approach is to make an exclusive reticle for the project itself, instead of using the MPW reticle. This is also very expensive if the production volume is not large enough to justify such an investment. Therefore, a cost effective method is yet to be introduced.

SUMMARY OF THE INVENTION

The main objective of the present invention is to provide a wafer lithographic shielding mask and a wafer lithography method, so as to reduce wafer production cost using MPW reticles.

In order to achieve the above objective, the present invention provides a wafer lithographic shielding mask having a light shielding layer and at least one transparent region. The position and shape of the transparent regions must allow exposing the layout patterns of the designated chips on the MPW reticle onto the photoresist layer on the surface of the wafer and allow the layout patterns of the designated chips on the reticle to be completely transferred to the photoresist layer on the surface of the wafer. The wafer lithographic shielding mask can be disposed on the light transmission path from a lithographic light source to a wafer. Preferably, they can be placed between the MPW reticle and the lithographic light source or between the MPW reticle and the wafer.

The wafer lithography method of the present invention comprises the following steps: (1) A wafer lithographic shielding mask for selecting the exposure regions of the MPW reticle is disposed on the light transmission path from a lithographic light source to a wafer, e.g., between an MPW reticle and a lithographic light source or between the MPW reticle and the wafer. (2) A wafer is moved to a site to be exposed and a shutter is opened to perform exposure. One or more lithographic light projection areas on the MPW reticle are selected via the transparent regions of the wafer lithographic shielding mask, such that the layout patterns of the designated chips on the MPW reticle are transferred to the wafer coated with a photoresist layer. After a period of exposure, the shutter is closed. (3) Thereafter, the wafer is moved to the next site to be exposed, and the shutter is opened to permit exposure. This process is repeated until all sites allowed to expose are exhausted. (4) After exposure is done completely, the photoresist development is performed to remove the photoresist on the exposed regions. The regions on the developed wafer that are not covered by the photoresist are then etched. Finally, the photoresist layer on the wafer is removed.

The wafer photolithography method provided by the present invention can, to a certain extent, avoid fabricating undesired chips on the wafer using the MPW reticle. When some projects later find out that their chips fabricated with MPW work pretty well and decide to go with volume production, they can reuse the MPW reticle to save reticle (mask) tooling cost and use the shielding mask disclosed in the present invention to save wafer production cost.

BRIEF DESCRIPTION OF THE DRAWINGS

FIG. 2(*b*) is a lithographic device according to another embodiment of the present invention.

DETAILED DESCRIPTION OF THE INVENTION

The appended drawings will be used to clearly disclose the technical characteristics of the present invention.

Figure 1:
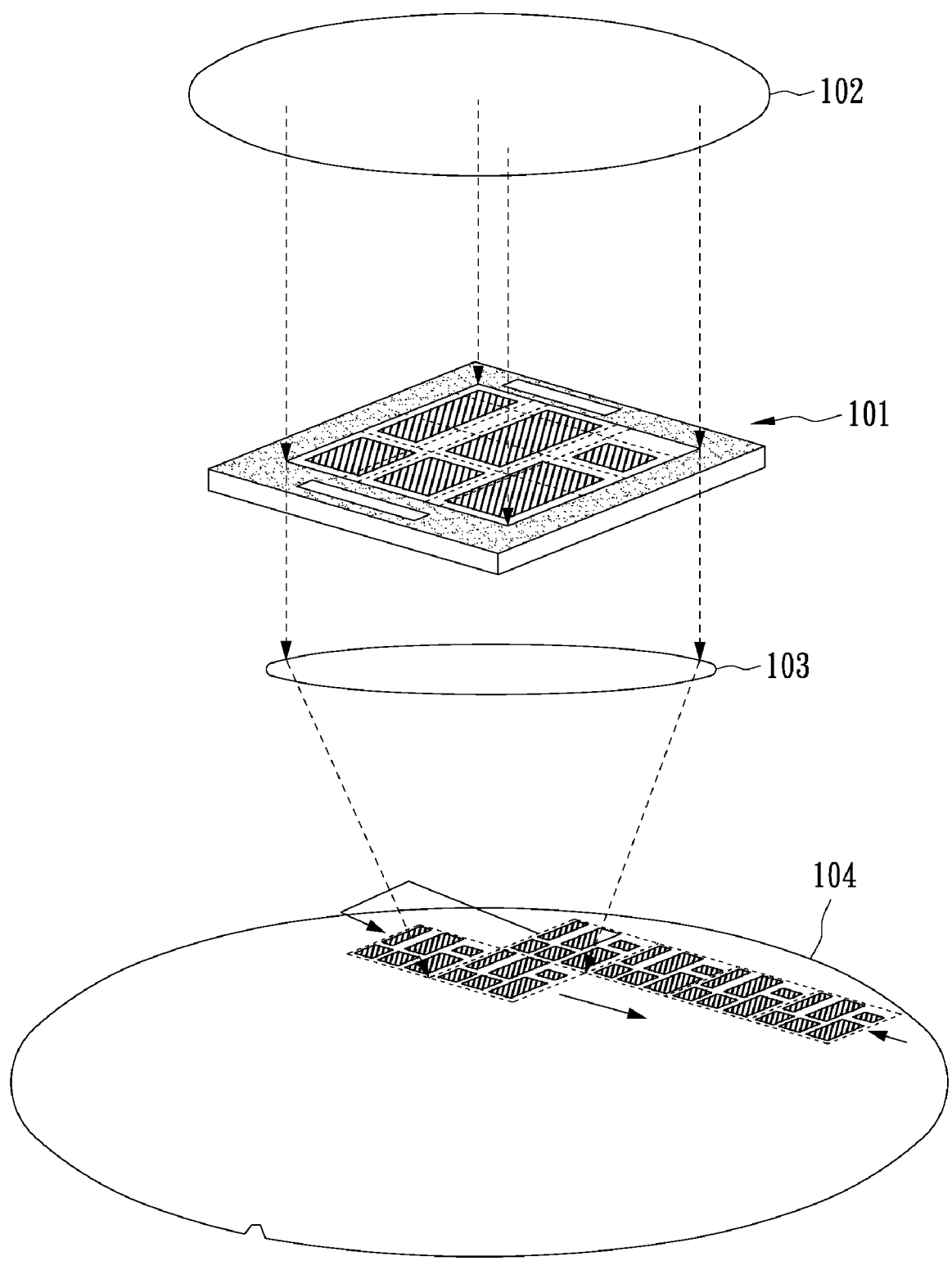
FIG. 1 is a conventional lithographic device.
Figure 2A:
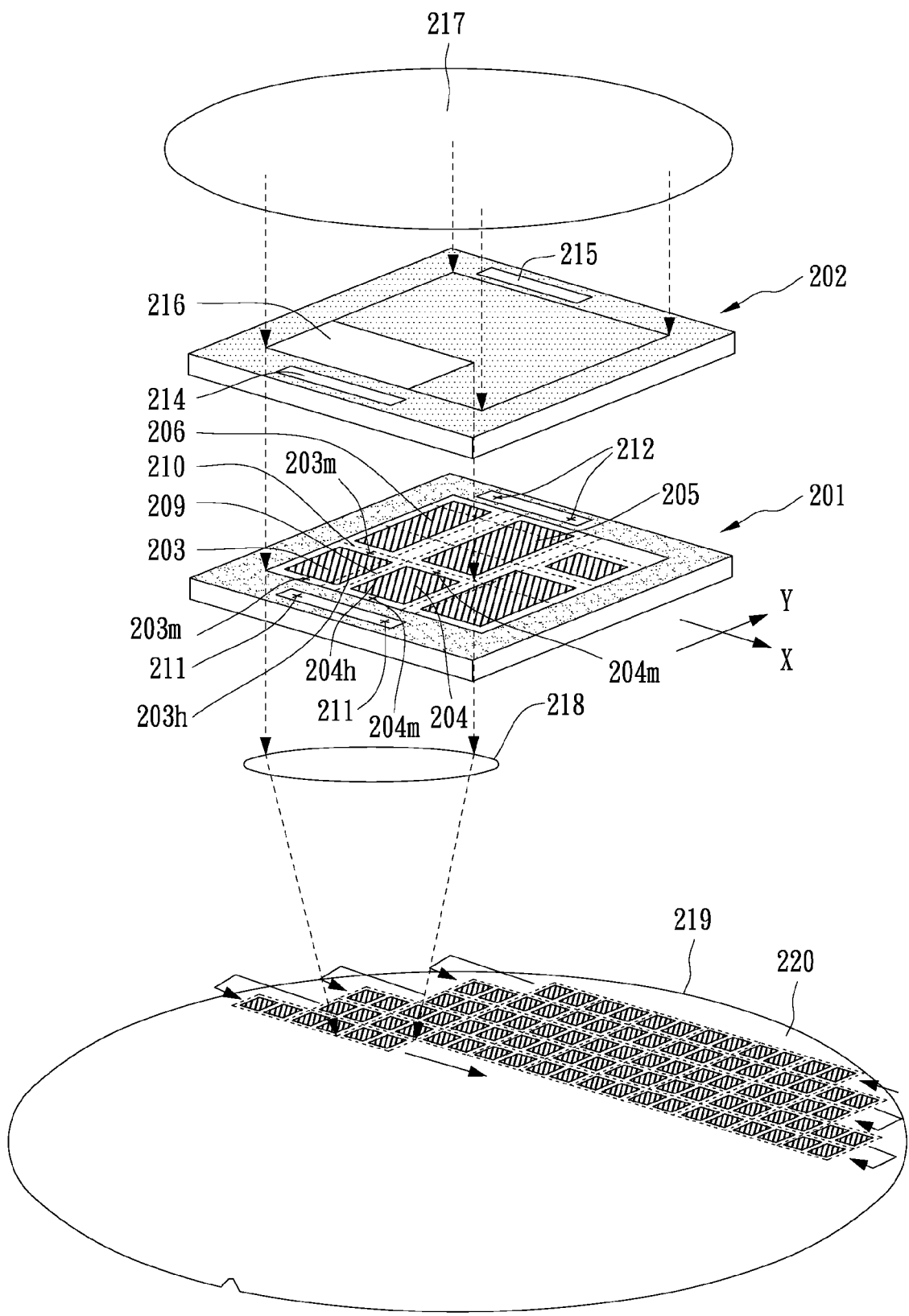
FIG. 2(*a*) is a lithographic device according to an embodiment of the present invention.

FIG. 2(a) is a lithographic apparatus according to an embodiment of the present invention. When an MPW reticle 201 is being fabricated, it is additionally provided with fine alignment marks for some projects on the reserved regions where a diamond blade will be applied, for example, fine alignment marks 203m and 204m on the reserved regions used for wafer sawing. The fine alignment marks are used to align the patterns to be exposed with the patterns already formed on the wafer, so as to achieve the fine alignment of the layout patterns to be fabricated.

First, the layout patterns of the chips to be fabricated are selected with reference to the floorplan of the MPW reticle 201. In the present embodiment, the chips 203 and 204 are selected to get exposure. The neighboring sides 203h and 204h of chips 203 and 204 have the same length and their bottom Y coordinates are the same. Moreover, the chips 203 and 204 share sawing lines 209 and 210.

A wafer lithographic shielding mask 202 for selecting the exposure regions of the MPW reticle 201 is disposed on the light transmission path from a lithographic light source 217 to a wafer 219 and is placed between the MPW reticle 201 and a lithographic light source 217. When fabricating the wafer lithographic shielding mask 202 for selecting the exposure regions of the MPW reticle 201, a transparent region 216 must at least allow the light beam from the lithographic light source 217 being irradiated over the chips 203 and 204 to perform exposure. The dashed lines on the surface of the reticle 201 are virtual sawing lines (sawing lines 209, 210), which indicate the possible sawing positions after wafers are fabricated. The transparent regions 214 and 215 are used for alignment such that the reticle alignment marks 211 and 212 on the MPW reticle can align with the stepper through the transparent regions 214 and 215.

Then, the stepper moves a wafer 219 to a site yet to be exposed. When the aligning task is completed, the shutter (not shown) is opened such that the light beam from the lithographic light source 217 traveling through the wafer lithographic shielding mask 202, the MPW reticle 201, and a projection lens 218 is projected on the photoresist layer 220 of the wafer 219. After a period of exposure, the shutter is closed and the wafer 219 is moved to the next site to be exposed. This process is repeated until all sites allowed to expose are exhausted.

In FIG. 2(a), the stepping method on the wafer 219 is only one type of methods, which can be replaced by other stepping method, as long as the exposed regions can make the wafer produce more dice. The commonly used steppers are divided into two types, namely step-and-repeat aligners and step-and-scan systems. The former is taken as an example in the present embodiment, and the latter can also be used. If the latter is used, the scanning only needs to be performed over the area at least comprising the transparent region 216 on the wafer lithographic shielding mask 202 instead of the whole wafer lithographic shielding mask. Moreover, the commonly used lithographic light source 217 is a mercury arc lamp for generating an exposure light beam such as a g-line with a wavelength of 436 nm, an h-line with a wavelength of 405 nm, and an i-line with a wavelength of 365 nm. Also, the lithographic light source 217 can be an excimer laser such as a KrF excimer laser with a wavelength of 248 nm, an ArF excimer laser with a wavelength of 193 nm, and an F2 excimer laser with a wavelength of 157 nm.

Then, the exposed photoresist layer 220 of the wafer 219 is developed, and the photoresist at the exposed regions is removed. Basically, the photoresist development uses a chemical developer solution to dissolve the photoresist at the exposed regions.

The regions not covered by the photoresist layer 220 on the developed wafer 219 are etched in a manner of dry etching, wet etching, or both.

Finally, the photoresist layer 220 on the wafer 219 is removed, i.e., the so-called photoresist removal step, so as to remove the photoresist layer which is now useless. Photoresist removal methods are mainly divided into two types, namely wet stripping and dry stripping. The wet stripping uses organic solutions or inorganic solutions to destroy the structure of the photoresist. The dry stripping uses plasma to remove the photoresist. Generally, the above two methods are used together to completely remove the photoresist layer and avoid leaving residual substances after the plasma etching.

Figure 2B:
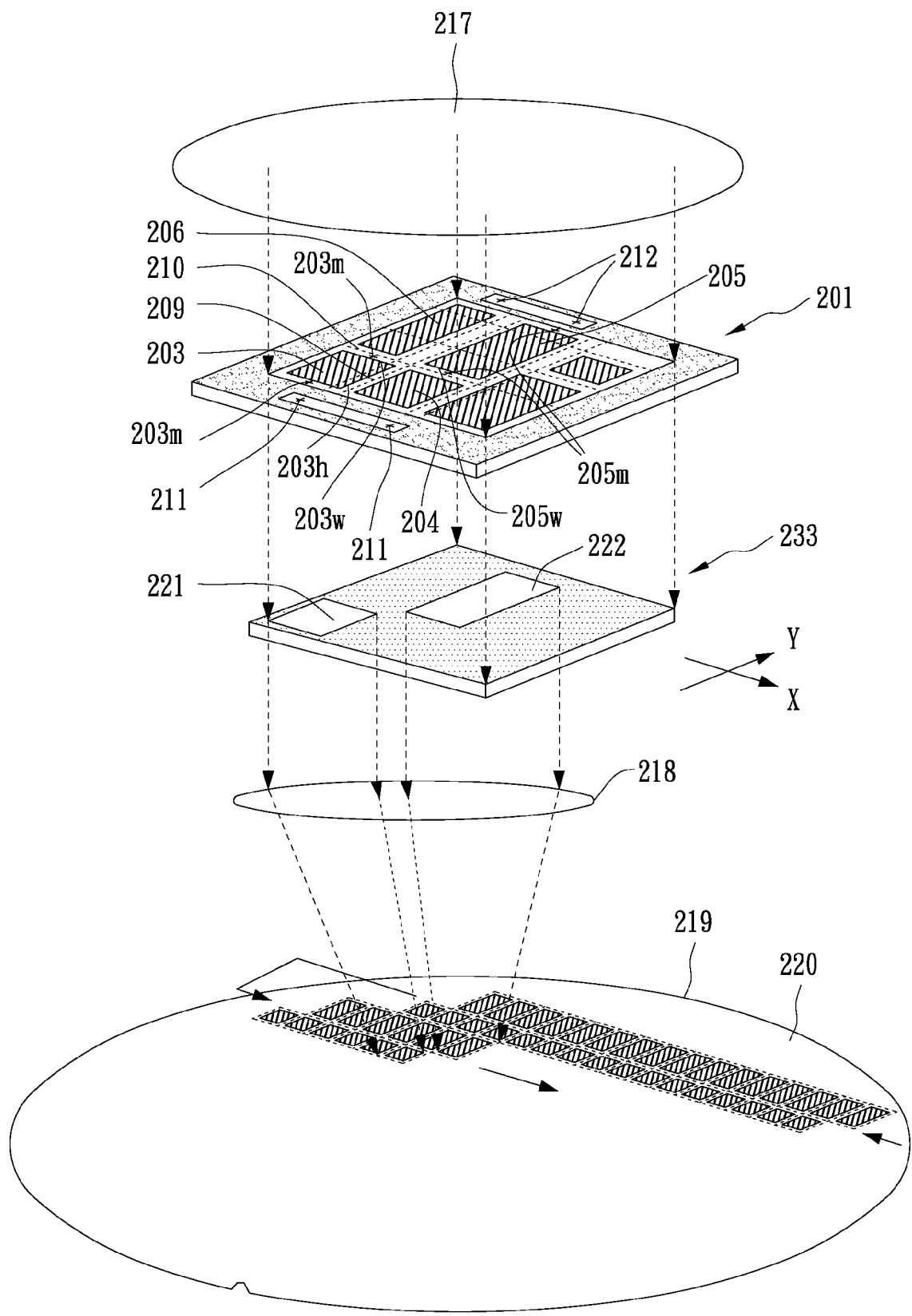

FIG. 2(b) is a device for lithographic process according to another embodiment of the present invention. When an MPW reticle 201 is being fabricated, it is additionally provided with fine alignment marks for some projects on the reserved regions where a diamond blade will be applied, for example, fine alignment marks 203m and 205m on the reserved regions used for wafer sawing. The 15 fine alignment marks are used to align the patterns to be exposed with the patterns already formed on the wafer, so as to achieve the fine alignment of the layout patterns to be fabricated.

First, the layout patterns of the chips to be fabricated are selected with reference to the floorplan of the MPW reticle 201 in FIG. 2(b). In the present embodiment, the chips 203 and 205 are selected to get exposure. The chips 203 and 205 are disposed diagonally adjacent to each other. One side 203w of the chip 203 has the same length as one side 205w of the chip 205, and both chips 203 and 205 share the sawing lines 209 and 210.

A wafer lithographic shielding mask 233 for selecting the exposure regions of the MPW reticle 201 is disposed on the light transmission path from a lithographic light source 217 to a wafer 219 and is placed between the MPW reticle 201 and the wafer 219. When the wafer lithographic shielding mask 233 is fabricated, the transparent regions 221 and 222 must be at least capable of selecting the chips 203 and 205 on the MPW reticle 201 to get exposure. In the present embodiment, the shape and position of the wafer lithographic shielding mask 233 for selecting the exposure regions of the MPW reticle 201 do not affect the operation of the alignment system that uses the alignment marks on the MPW reticle 201.

Then, the stepper moves a wafer 219 to a site yet to be exposed. When the aligning task is completed, the shutter (not shown) is opened such that the light beam from the lithographic light source 217 traveling through the MPW reticle 201, wafer lithographic shielding mask 233, and a projection lens 218 is projected on the photoresist layer 220 of the wafer 219. After a period of exposure, the shutter is closed and the wafer 219 is moved to the next site to be exposed. This process is repeated until all sites allowed to expose are exhausted.

Similarly, the stepping method shown in FIG. 2(b) can be replaced by other stepping methods. For example, if a step-and-scan system is adopted, the scanning only needs to be performed over the area at least comprising the transparent regions 221 and 222 on the wafer lithographic shielding mask 233 instead of the whole wafer lithographic shielding mask.

According to the above embodiments, after the fabrication of the wafer is complete, all the dice on the wafer can be completely sawed out without destroying a die. Moreover, because only the desired chips are fabricated, the waste of the wafer is greatly reduced.

The present invention can also select the chips 203, 205 and 206 in FIG. 2(b) to be exposed at the same time. The sawing line along the right edge of the dice fabricated for the chip 206 may cause damage to the dice fabricated for the chip 203 in the same exposure region. Similarly, the dice fabricated for the chip 206 may not be properly packaged when the dice fabricated for the chip 203 are selected to be sawed out. However, the dices fabricated for the chip 203 and the dice fabricated for the chip 206 in different exposure regions on the same wafer can be sawed out from the wafer. Since only desirable chips are fabricated, the wafer production cost is reduced considerably.

The above-described embodiments of the present invention are intended to be illustrative only. Numerous alternative embodiments may be devised by those skilled in the art without departing from the scope of the following claims.

What is claimed is:

1. A mask set comprised of a wafer lithographic mask and an MPW reticle being disposed on a light transmission path from a lithographic light source to a photoresist coated wafer, the mask set comprising:
    a wafer lithographic mask having a light shielding layer and a plurality of transparent regions;
    and an MPW reticle wherein said MPW reticle comprises layout patterns of chips formed on said MPW reticle, wherein said plurality of transparent regions on said wafer lithographic mask are positioned and shaped to allow exposure of said layout patterns of chips onto said photoresist coated wafer by a single lithographic exposure process.

2. The mask set according to claim 1 wherein the wafer lithographic shielding mask is disposed between the MPW reticle and the lithographic light source.

3. The mask set according to claim 1 wherein the wafer lithographic shielding mask is disposed between the MPW reticle and the photoresist coated wafer.

4. The mask set according to claim 1 wherein the wafer lithographic shielding mask further comprises at least one transparent region for alignment, such that at least one reticle alignment mark on the MPW reticle is aligned with a stepper through the at least one transparent region for alignment.

5. A wafer lithography method, comprising:
    disposing a wafer lithographic shielding mask and an MPW reticle on a light transmission path from a lithographic light source to a photoresist coated wafer, wherein said MPW reticle comprises layout patterns of chips formed on said MPW reticle; the wafer lithographic shielding mask comprises a light shielding layer and a plurality of transparent regions that are positioned and shaped to allow exposure of said layout patterns of chips onto said photoresist coated wafer; and
    exposing said photoresist coated wafer with light beams radiated from the lithographic light source through the layout patterns of chips and plurality of transparent regions by a single lithographic exposure process so as to transfer the layout patterns of chips onto said photoresist coated wafer.

6. The wafer lithography method according to claim 5, wherein the wafer lithographic shielding mask is disposed between the MPW reticle and the lithographic light source.

7. The wafer lithography method according to claim 5, being disposed between the MPW reticle and the photoresist coated wafer.

8. The wafer lithography method according to claim 5, wherein the wafer lithographic shielding mask further comprises at least one transparent region for alignment.

9. The wafer lithography method according to claim 8, wherein the at least one transparent region for alignment is used to allow at least one reticle alignment mark on the MPW reticle to be aligned with a stepper.

10. The wafer lithography method according to claim 5, wherein the MPW reticle comprises at least one fine alignment mark.

11. The wafer lithography method according to claim 10, wherein the at least one fine alignment mark is used to align layout patterns to be exposed with the layout patterns already formed on the photoresist coated wafer.

12. A wafer lithography apparatus for exposing a photoresist coated wafer, comprising:
    a lithographic light source;
    an MPW reticle comprising layout patterns of chips; and
    a wafer lithographic shielding mask comprising: a light shielding layer; and
    a plurality of transparent regions being positioned and shaped to allow exposure of the layout patterns of chips onto a photoresist coated wafer by a single lithographic exposure process;
    wherein the MPW reticle and the wafer lithographic shielding mask are disposed on a light transmission path from the lithographic light source to the photoresist coated wafer.

* * * * *